(12) United States Patent
Verilhac et al.

(10) Patent No.: US 8,288,267 B2
(45) Date of Patent: Oct. 16, 2012

(54) METHOD FOR MAKING AN ELECTRIC INTERCONNECTION BETWEEN TWO CONDUCTING LAYERS

(75) Inventors: Jean-Marie Verilhac, Grenoble (FR); Jacqueline Bablet, Le Gua (FR); Cécile Bory, Fontanil Cornillon (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 165 days.

(21) Appl. No.: 12/775,717

(22) Filed: May 7, 2010

(65) Prior Publication Data
US 2010/0221909 A1    Sep. 2, 2010

Related U.S. Application Data

(63) Continuation of application No. PCT/FR2008/051947, filed on Oct. 29, 2008.

(30) Foreign Application Priority Data

Dec. 17, 2007    (FR) ...................................... 07 59881

(51) Int. Cl.
*H01L 21/44* (2006.01)
(52) U.S. Cl. ................................ 438/613; 257/E23.021
(58) Field of Classification Search .................. 438/622, 438/613; 257/E21.575, E23.021
See application file for complete search history.

(56) References Cited

U.S. PATENT DOCUMENTS

| 5,840,417 A | 11/1998 | Bolger |
| 2005/0277279 A1 | 12/2005 | Luo et al. |
| 2006/0045962 A1 | 3/2006 | Miura |
| 2006/0292769 A1 | 12/2006 | Wada et al. |

FOREIGN PATENT DOCUMENTS
EP    0 967 624 A2    12/1999

*Primary Examiner* — Mary Wilczewski
*Assistant Examiner* — Toniae Thomas
(74) *Attorney, Agent, or Firm* — Burr & Brown

(57) ABSTRACT

A method for making an electric interconnection between two conducting layers, separated by at least one insulation or semi-conducting layer, which includes forming a stud extending between at least the lower conducting layer and the upper conducting layer, where the nature and/or the shape of the stud impart non-wettability properties relative to the material used for the separating layer.

18 Claims, 4 Drawing Sheets

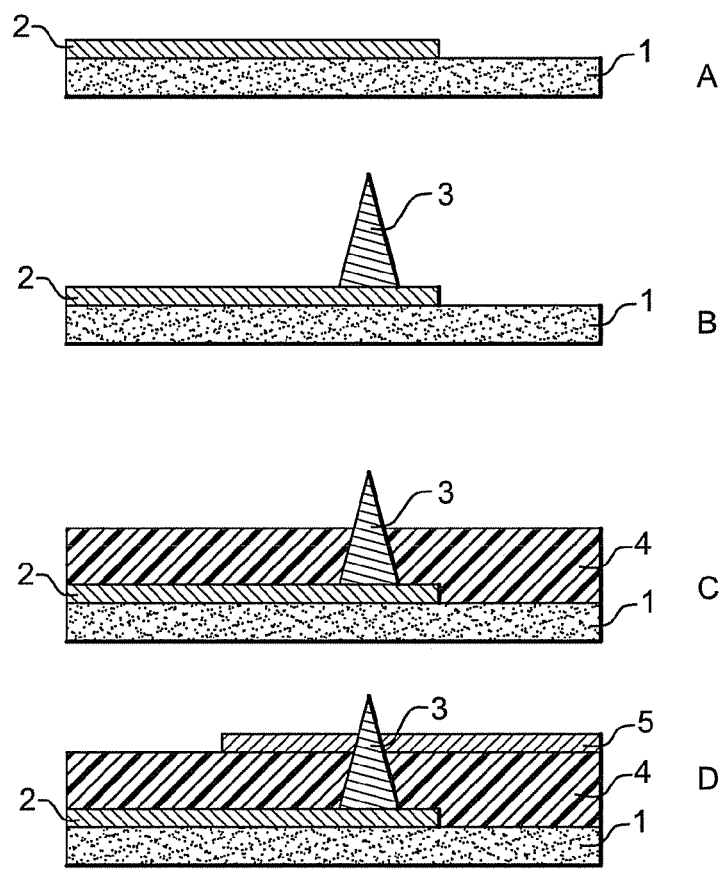
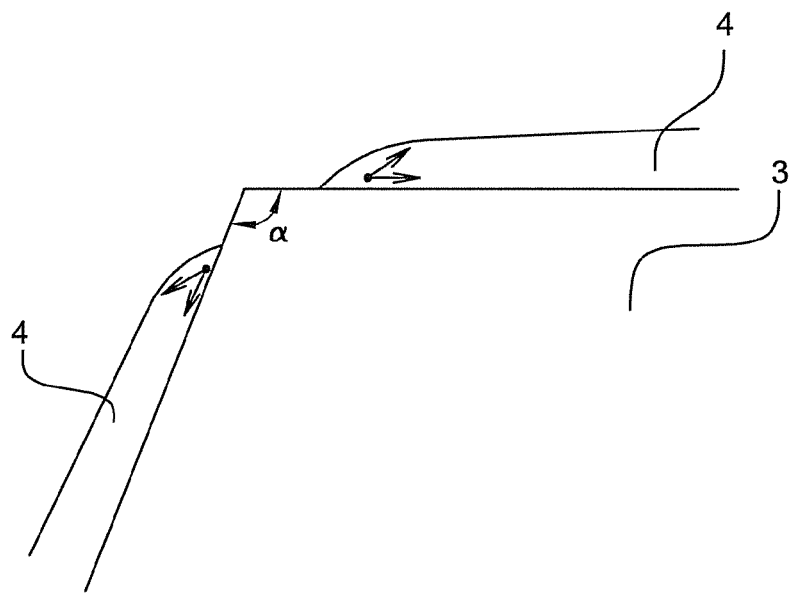

METHOD FOR MAKING AN ELECTRIC INTERCONNECTION BETWEEN TWO CONDUCTING LAYERS

FIELD OF THE INVENTION

The present invention relates to the making of an electric interconnection between two conducting layers separated by at least one insulation or semi-conducting layer, as implemented most specifically in the manufacture of electronic circuits.

It can be used in particular when the separating layer of insulation or semi-conducting material is deposited by a wet process.

The conventional term is a via which, in a known way, constitutes a conducting path through an insulation layer.

The present invention applies most specifically to the making of transistors, for which the via in question constitutes the conducting path through the gate insulator and the semiconductor.

It can also be used in a general way to make vias in the context of electronics that use organic and inorganic materials and/or hybrid organic-inorganic materials, in particular deposited by a wet process.

BACKGROUND OF THE INVENTION

Two methods may conventionally be distinguished in the making of vias, more generally employed to make field-effect transistors.

A first method, known as the "subtractive method," comprises making such vias by physical or chemical attack on the layer or layers of insulation or semi-conducting material to be passed through. This attack is delivered by laser ablation, solvent jet, embossing, or even by the use of a dielectric layer radiation curable under the effect of ultraviolet radiation. It is therefore necessarily made after the insulation or semi-conducting layer has been deposited.

Depending on the architecture used to make field-effect, and in particular "bottom-gate" or "top-gate" transistors, this attack stage occurs at the end of the process or in mid-process.

Such an attack is capable of generating pollutions, and in particular those constituted by fragments caused by the laser shot, solvent residues, as well as by impairments to the semi-conducting layer when the latter is subjected to ultraviolet radiation. Such pollutions prove in fact to be particularly critical when they affect the semi-conductor/insulator interface, and may be severely detrimental to the electrical performance of the transistors. Moreover, the accumulation of steps at the end of the process increases the danger of causing impairment to the layers already deposited, such impairment translating in particular into the disbonding of the layers after laser firing, or even the unintentional dissolution of part of the layers when the vias are made by jets of solvent, etc.

A second method, known as the "selective method," comprises depositing the insulation or semi-conducting layer selectively. This method comprises locally depositing the insulation or semi-conducting layer while avoiding some zones. In zones that are blank, in other words devoid of insulation or semi-conducting material, the first conducting level, in other words the lower layer of the conducting material, is bare. The blank zones are therefore intended to act as vias. This method has the advantage of not generating pollution of the type described in relation to the previous method.

To make a localized deposition, printing techniques such as flexography, heliography, inkjet, or serigraphy can be used. However, experience shows that the use of some dielectric or semi-conducting materials is difficult to formulate in an ink appropriate for printing techniques. The most straightforward are still full layer deposition using technologies that are well-known to those skilled in the art under the terms "spin coating," "dip-coating," "spray coating," etc. Moreover, these deposition methods do not provide sufficient spatial resolution in a large number of applications.

The objective targeted by the present invention is to make the interconnection vias while eliminating the drawbacks associated with the currently available techniques which have been briefly reviewed above.

SUMMARY OF THE INVENTION

The invention is therefore aimed at a method for making an electric interconnection between two conducting layers separated by at least one insulation or semi-conducting layer, known as the separating layer.

The method comprises forming a stud, prior to the making or deposition of the separating layer, extending at least between the lower conducting layer and the vicinity of the upper conducting layer, wherein the material constituting the stud and/or at least the external surface thereof, is chosen so as to have such surface tension in the solid state, that the surface tension ratio, of the material in the solid state to the separating layer in the liquid state respectively, is less than or equal to 7.

Put another way, the nature of the material constituting the stud is such that it has non-wettability properties relative to the separating layer which is made out of an insulation or semi-conducting material.

This stud is, as already stated, formed prior to the deposition of the separating layer, but also of the upper conducting layer.

In other words, the invention comprises forming a stud, that may or may not be conducting, and playing on its nature and/or on its shape or on its shape factor, so as to allow it to fulfil its electrical conduction function, either because of its nature, or because of the subsequent deposition of the upper conducting layer, capable of filling the non-wettability zone left blank of all insulation or semi-conducting material.

The wettability of a solid body by a solution may be characterized by the difference in the respective surface tensions $\gamma$ of the materials of which they consist, traditionally expressed as dynes/cm or as mN/cm.

Thus, for a plane (i.e. without relief) and horizontal surface, a poor wetting of a solution on a solid body corresponds to a surface tension ratio such that $$\frac{\gamma_{solid}}{\gamma_{liquid}} \leq 1.$$

In the context of the invention, the surface of the solid body (the stud) is not horizontal, the requisite dewetting occurring mainly along its lateral walls. In so doing, the forces of gravity which are exerted on the liquid are in opposition to the wetting forces. It therefore follows that the dewetting may appear for a surface tension ratio according to the relationship:

$$\frac{\gamma_{solid}}{\gamma_{liquid}} \geq 1$$

After analysis and research, it became clear that the dewetting or non-wetting character required for the stud was satisfactory, as soon as the surface tension ratio fulfils the relationship:

$$\frac{\gamma_{solid}}{\gamma_{liquid}} \leq 7$$

The invention is therefore aimed at forming a stud in accordance with this relationship.

To advantage, a stud will be chosen, in such a way that this surface tension ratio fulfils the relationship:

$$\frac{\gamma_{solid}}{\gamma_{liquid}} \leq 1$$

According to a first embodiment of the invention, the stud is made out of a conducting material and is deposited on the lower conducting layer, by ink jet technology or by serigraphy for example.

According to another embodiment of the invention, the stud is made out of a conducting material and is formed by deforming the first conducting layer or lower conducting layer.

To guarantee that the stud surface is not coated in its entirety when depositing the separating layer of insulation or semi-conducting material, the height of the stud is to advantage greater that the thickness of the insulation or semi-conducting layer.

However, it is conceivable to employ a stud, whereof the height is less than the thickness of the separating layer, in particular if the material constituting the latter is largely unwettable. This is particularly possible if the respective materials selected fulfil the relationship $$\frac{\gamma_{solid}}{\gamma_{liquid}} \leq 1$$

Moreover, the directional pitch of the sides of the stud has an effect on the non-wettability of the insulation or semi-conducting layer at this level. Typically, the pitch of the sides and in particular the value of the angle α between the horizontal and the sides is advantageously between 45 and 135°.

The conceivable shapes for the stud may be of different natures, and in particular conical, truncated cone shaped, cylindrical, spherical, parallelepiped.

According to the invention, the stud may also result from the deformation of the substrate on which the first layer of conducting material is deposited and from the subsequent deposition of the first conducting layer which then fully coats the substrate as well as the deformation thereof.

In the same order of idea, the stud may be added to the substrate prior to the deposition of the first conducting layer.

According to another embodiment of the invention, the stud may be made out of an insulation material that defines at its periphery a non-wettable zone for the semi-conducting or insulation material deposited subsequently on the first conducting layer. According to this embodiment, electrical conduction between the lower conducting layer and the upper conducting layer results from the deposition of the upper conducting layer which then fills the non-wetting zone previously defined around the stud.

BRIEF DESCRIPTION OF THE DRAWINGS

The way in which the invention can be implemented and the resulting advantages thereof will become clearer from the following embodiment examples, given by way of information and non-restrictively, supported by the appended figures.

FIGS. 1A to 1D are a diagrammatic representation of the underlying principle of the present invention.

FIG. 2 is a diagrammatic representation intended to show the mechanism of dewetting the insulation layer on the stud surface.

DETAILED DESCRIPTION OF THE INVENTION

Figure 3:
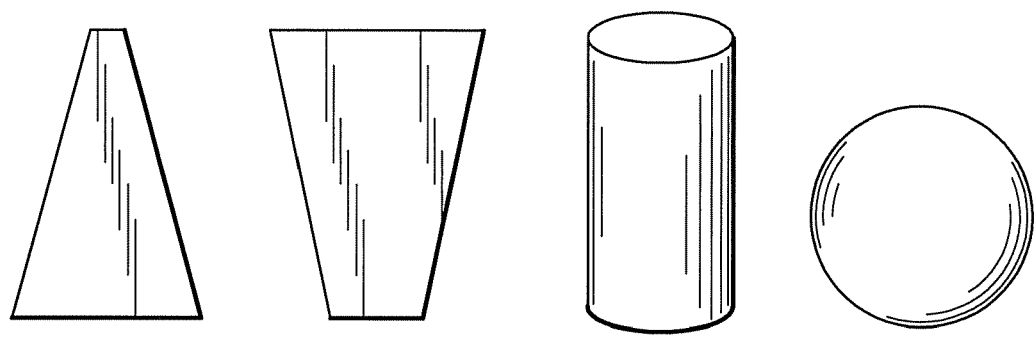
FIG. 3 shows different possible shapes of the inventive stud.

As will have been understood, the present invention proposes two possible methods for making a via to interconnect two conducting layers 2, 5, separated by an insulation or semi-conducting layer 4.

According to the invention, this via is implemented by forming a stud 3, added on to the lower conducting layer 2 or directly onto the substrate 1, on which the lower conducting layer is deposited, or emanating from this lower conducting layer.

Depending on the conducting or non-conducting nature of the initial stud 3, different methods are conceivable.

According to a first method intended to form a stud that is directly conducting, in other words wherein the nature of its constituent material is conducting, and made for example out of Au, Cu, Ag or conducting polymers such as PDOT-PSS (poly(3,4-ethylenedioxythiphene) polystyrenesulphonate), the geometry of the first lower conducting layer 2 is modified.

This layer 2 is conventionally deposited onto a substrate 1 of any nature, and particularly one that is insulating, or possibly semi-conducting. Layer 2 is for example made out of gold, platinum, copper, nickel, aluminium, etc. and the substrate 1 for example out of plastic material.

According to the invention, the layer 2 is deformed particularly by laser radiation attack. The conducting layer 2 and/or its carrier 1, is thus able to absorb all or part of the pulsed or continuous laser radiation. One or more of these layers may thus be ablated or melted, thereby creating a deformation at least of the conducting layer 2. To be more precise, the topology of the conducting metal layer 2 is modified at the boundary of the laser shot. To be more precise, the conducting layer 2 tends to disbond from the carrier 1 at the edges of the laser shot. This disbonding may thus act as a conducting stud to form the inventive vias. The shape of the deformation so generated will depend on the shape of the laser spot, circular or linear, on its power, on its duration, on the number of pulses (in the context of the use of a pulsed laser), on the interaction of its wave length with the deformable layers and on the mechanical properties, particularly of the conducting layer to be deformed, and particularly on its ductility and on its thickness.

Excimer lasers may thus be used (wavelength 308 nm) or another wavelength, or YAG laser, or even C0$_2$ laser.

The resulting deformation will thus prevent wetting.

According to one alternative to this inventive method, it is also possible to use embossing or micro-embossing to deform the first conducting layer 2 and thereby form the stud. This deformation may damage either the conducting layer 2 directly, or the assembly constituted by the conducting layer 2 and the substrate 1.

Whatever method is implemented to deform the lower conducting layer 2, an excrescence is created relative to the general plane in which the conducting layer 2 is located, which is provided with sufficient height so as to be, in the example described, greater than the thickness of the insulation layer 4 intended to coat the lower conducting layer 2 and thereby provide the electric conduction with the upper conducting layer 5 and to do so, in accordance with the invention.

The deformation of this lower conducting layer may also result from a mechanical "scratching" attack, a chemical attack, an electric attack (electro-erosion), a thermal attack, a magnetic attack, or even by a plurality of these methods coupled together.

This attack or these attacks induce the formation of excess thickness at the periphery of the point of attack. It is this phenomenon which is exploited under the invention.

When the stud 3 is constituted in this way, the insulation or semi-conducting layer 4 can then be deposited. Such an insulation layer is for example constituted by a polymer such as PMMA, polyvinylphenol, polyolefins, polysulphones, polyimide.

When it is made out of a semi-conducting or semi-insulating material, it can then be made of pentacene, polythiophenes, polytriarylamines.

Given the shape of the stud, described hereinafter in further detail, the result is a partial dewetting of the stud.

This dewetting results first of all from gravity, which tends to make the insulation or semi-conducting material in solution constituting the layer 4 (when the solvent is not yet evaporated) seep along the sides of the stud, which tends to reduce the thickness of the layer of insulation or semi-conducting material on the sides.

This partial dewetting of the stud further results from the surface tension phenomena appearing at the angle α formed by the upper surface of the stud and the side or sides of the stud, and as shown for example in FIG. 2.

Typically a metal stud thus has a surface tension in the vicinity of $\gamma_{metal} \approx 50$ dynes/cm (at ambient temperature and under atmospheric pressure). The solution constituting the separating layer has for its part a typical surface tension $\gamma_{liquid} \approx 10$ to 20 dynes/cm.

It can be stated consequently that the condition targeted by the invention is fully satisfied, since according to this data, the result is $$\frac{\gamma_{metal}}{\gamma_{liquid}} \approx 2.5 \text{ to } 5.$$

It can thus be seen that in order to optimize dewetting, the angle α is to advantage selected to be between 45 and 135°.

Thus, the quantity of liquid constituting the insulation or semi-conducting layer tends to be minimized to the maximum on the surface in contact with the stud. This phenomenon depends inter alia on the viscosity of the solution of the insulation or semi-conducting material and on the angle of contact between the solution and the surface.

To guarantee a partial coating of the surface of the stud, and to be more precise to ensure that the upper surface of the stud, in other words the surface of the stud intended to be above the layer of insulation or semi-conducting material 4 after deposition thereof, and as already said, arrangements are made for the height of the stud to be greater than the thickness of the insulation or semi-conducting layer 4.

However, assuming that the relation $$\frac{\gamma_{stud}}{\gamma_{liquid}} \leq 1$$

is verified, the height of the stud may be less than the thickness of the separating layer 4.

Lastly, the smaller the surface of the stud base (stud/lower layer interface) the greater the non-wettability of the stud, which means that a larger contact surface can be obtained between the two conducting layers.

In fact, different stud shapes are conceivable and shown by way of example in FIG. 3. Typically, these studs may be truncated cone shaped, inverted truncated cone shaped, cylindrical, spherical or parallelepiped.

Additionally, in order to impart the non-wettable character to the stud, it is conceivable to impart a surface roughness thereto, for example by chemical attack (acid), by physical attack (plasma) or mechanical attack (abrasion) etc.

Thus, a very rough surface, in particular on the surface or upper zone, of the stud, promotes dewetting.

These rough areas may be defined by the magnitude Ra, denoting the mean deviation or the arithmetic mean of the distances separating the peaks and troughs of the rough areas relative to a median line or a median plane, in other words along the line or plane passing through the "mean" middle of the peaks and troughs.

Thus, and according to one inventive feature, a satisfactory result in terms of non-wettability is obtained if this value of Ra fulfils the relationship:

$$\frac{e}{2Ra} \leq 3$$

where e denotes the thickness of the separating layer 4.

To advantage, Ra is chosen such that this relationship is less than or equal to 1.

Figure 4:
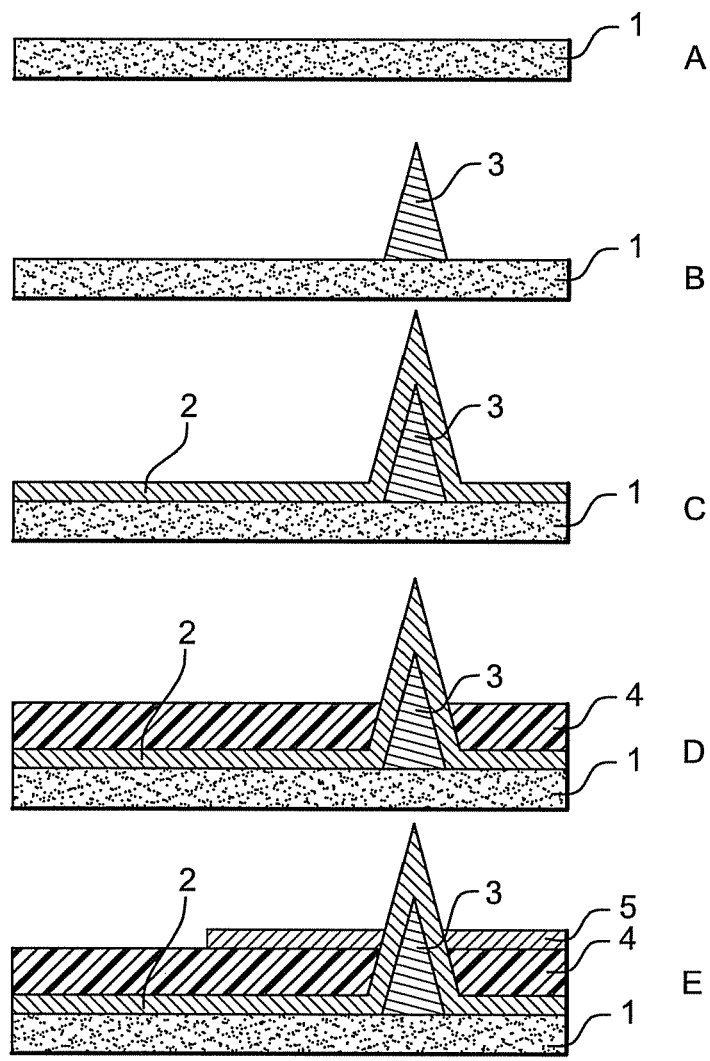
FIGS. 4A to 4E are a diagrammatic illustration of one embodiment of the invention based on a stud formed directly on the substrate.

According to one inventive alternative supported by the drawing in FIG. 4, the stud may be formed before the deposition of the lower conducting layer 2. To do this (FIG. 4B), the layer constituting the substrate is deformed or a non-conducting stud 3 is added to the substrate.

The substrate may be deformed by laser attack, as already specified previously.

If it is added to the substrate 1, a stud made of insulation material, like polymer or ceramic for example, is then deposited for example by inkjet technology, or by serigraphy, heliography or flexography.

The lower conducting layer 2, which coats the lateral surfaces of the stud, is then deposited (FIG. 4C), so that it can fulfil its subsequent conducting function. This lower conducting layer is deposited conventionally by sputtering. This lower conducting layer may also be deposited by liquid process which then coats the whole surface of the stud. To do this the so-called "spray coating" technique is used, or an electroless technique.

The insulation or semi-conducting layer 4 is then deposited, whereof it is observed that it extends over a height smaller than the overall height of the stud, and lastly the upper conducting layer 5 is deposited. It may be seen that the latter comes into contact with the conducting layer coating the sides of the stud 3 and hence, resulting in a via in accordance with the invention.

Figure 5A:
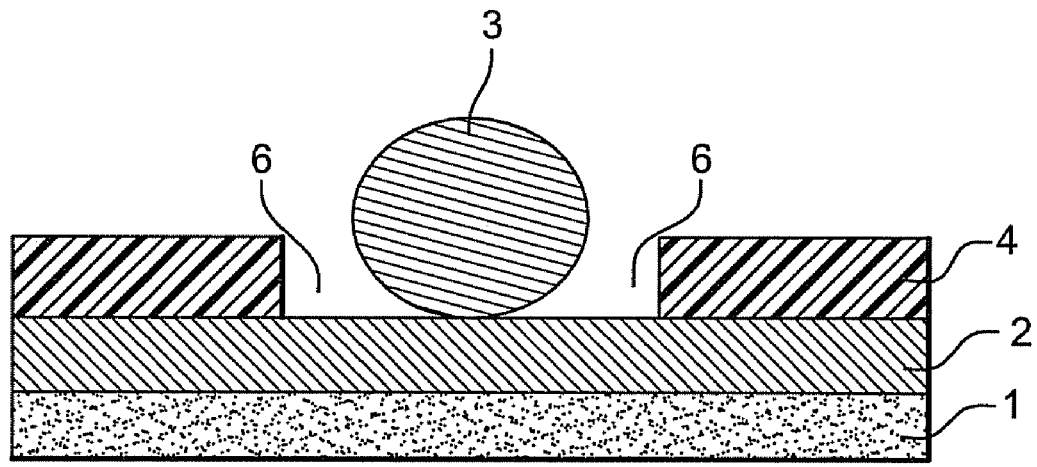
FIGS. 5A to 5B show the principle of forming a stud out of a non-conducting material.
Figure 5B:
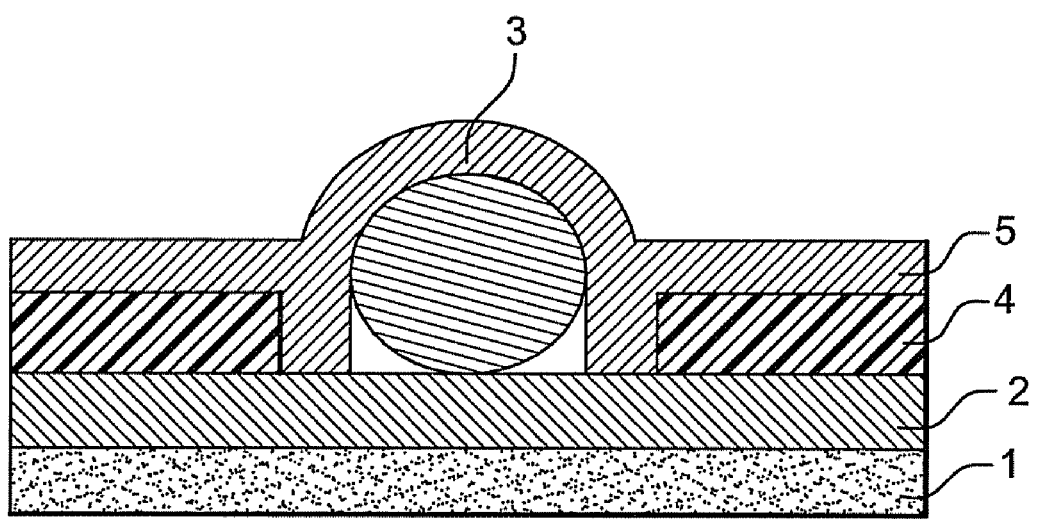

According to another inventive method, described for example in relation to FIGS. 5A and 5B, a non-conducting stud is employed. Thus for example, a glass micro-bead is deposited on the lower conducting surface 2, using inkjet technology for example. This micro-bead typically has a diameter in the vicinity of one micrometre suitable for a thickness of the insulation or semi-conducting material layer 4 of about 400 nanometers.

This microbead 3 proves partially dewetting with a material such as polyvinylphenol constituting the insulation layer 4. A zone 6 is in fact created on either side of the bead 3 devoid of insulation material when the layer of the material has been deposited.

When the upper conducting layer 5 is deposited, it partially fills the peripheral zone 6 of the stud, free of insulation material, and comes into contact with the lower conducting layer 2, thereby constituting a via for the structure so obtained.

Quite obviously, the lower the chemical affinity between the layer of insulation or semi-conducting material to be deposited on the stud, the more effective will be the dewetting implemented around the stud. In fact, to promote the dewetting of the solution constituting the separating layer 4 on the stud, it is possible to chemically modify the surface of the stud. To this end, the surface is coated, for example by dipping or by vapour phase deposition, with SAM (acronym for Self Assembled Monolayer) non-wettable by the solution constituting the separating layer 4. SAMs can thus be employed that have a thiol group (—SH) and a hydrophobic group (of the alkyl, alkylhalogenated, benzyl type etc.). The thiol group allows a strong chemical bond to be created with the metals (Au, Ag, etc.) capable of constituting the stud, and the hydrophobic groups promote the dewetting.

If in the example described, the stud is non-conducting, this particular method may also operate with a conducting stud.

Figure 6:
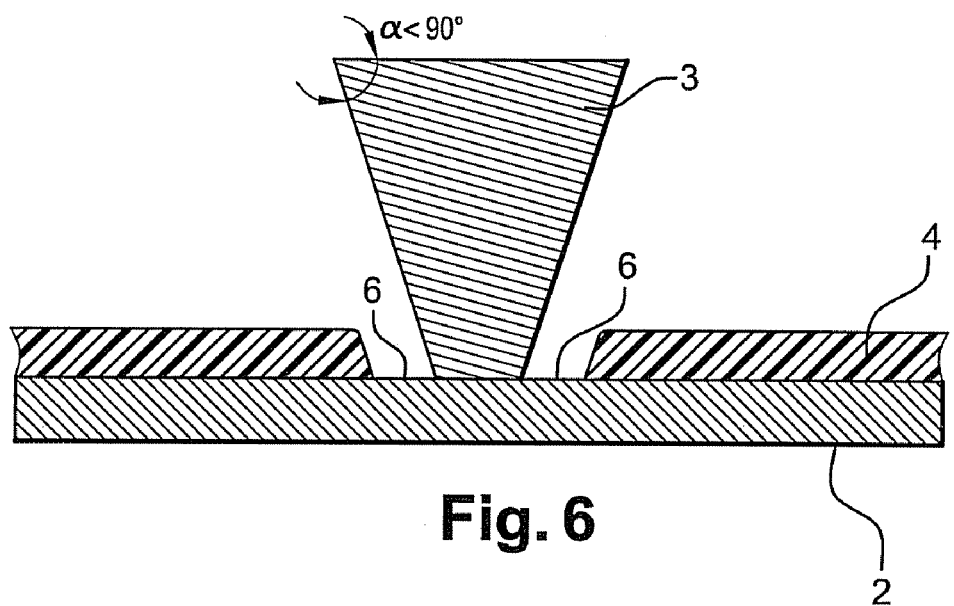
FIG. 6 is a diagrammatic view showing the implementation of a stud that has an angle α below 90°.

The implementation has been shown, in relation to FIG. 6, of an inverted truncated cone shaped stud capable of being installed instead and in place of the sphere or microbead in FIGS. 5A and 5B. In this case, the angle α as defined previously, is below 90°. In the same way a non-wettability zone 6 is defined at the periphery of the small base of the stud in contact with the lower conducting layer 2.

When the stud is formed using inkjet technology, one or more drops may be deposited successively at the same point in order to produce the required geometric characteristics, and in particular to produce the sufficient height of the stud relative to the respective thickness of the lower conducting layer and the insulation or semi-conducting layer. Thus, the height of the stud depends on the number of drops deposited, on the thickness of each of the drops and on the waiting time between the deposition of two successive drops. What is more, the stud may be oriented by a variable angle relative to the substrate.

Figure 7:
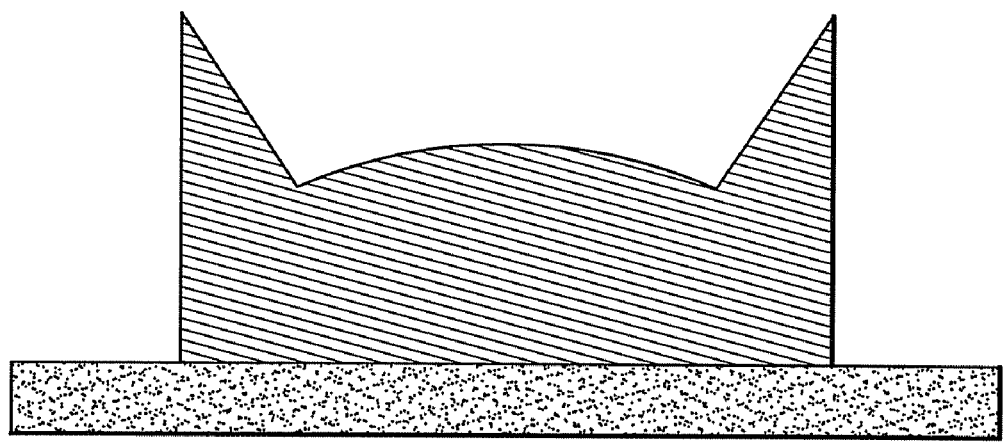
FIG. 7 is a diagrammatic view intended to show the "coffee stain" effect, which can be used in the context of the invention.

Implementing this inkjet technology may lead to the well-known "coffee-stain" effect as shown in FIG. 7. This phenomenon results from the evaporation difference between the center and the edges of the drop, generating a gradient of concentration which pushes the solution towards the edges, thereby creating an excess thickness. This excess thickness may, because of its non-uniformity, generate problems, and for example short-circuits between the layers. This effect is therefore in general to be avoided. But in the context of the invention, by controlling this effect, it is possible to play on the topology of the side of the stud, thereby promoting the non-wettability of the stud with the layer of insulation or semi-conducting material, thereby making it possible to guarantee the conducting character of the stud with the upper conducting layer.

The full advantage may be conceived of the present invention which, by playing on the non-wettability of a stud, allows a junction to be made between two conducting layers by passing through an insulation or semi-conducting layer, simplifying the manufacturing techniques, in particular of organic or inorganic electronic components, such as field-effect transistors, but also micro-systems for biology, antennae, micro-batteries, fuel cells, etc.

The invention claimed is:

1. A method for making an electric interconnection between two conducting layers separated by at least one insulation or semi-conducting layer, known as a separating layer, wherein it comprises forming a stud prior to the making or deposition of the separating layer, extending at least between the lower conducting layer and the vicinity of the upper conducting layer, wherein the constituent material of the stud, and at least the external surface of the stud, is chosen to provide such surface tension in the solid state, that the ratio of the surface tensions, of said material in the solid state to the separating layer in the liquid state respectively, is less than or equal to 7.

2. The method as claimed in claim 1, wherein said surface tension ratio of said material in the solid state to the separating layer in the liquid state respectively, is less than or equal to 1.

3. The method as claimed in claim 2, wherein the height of the stud is less than the thickness of the separating layer.

4. The method as claimed in claim 1, wherein the stud is made out of a conducting material and is deposited on the first lower conducting layer.

5. The method as claimed in claim 4, wherein the stud is deposited on the first lower conducting layer by inkjet technology or by serigraphy.

6. The method as claimed in claim 1, wherein the stud is made out of a conducting material and is formed by deformation of the first lower conducting layer.

7. The method as claimed in claim 1, wherein the height of the stud is greater than the thickness of the separating layer.

8. The method as claimed in claim 1, wherein the directional pitch of the sides of the stud relative to the horizontal is between 45 and 135°.

9. The method as claimed in claim 1, wherein the stud has a shape chosen from the group that includes the cone, the truncated cone, the inverted truncated cone, the cylinder, the sphere and the parallelepiped.

10. The method as claimed in claim 1, wherein the stud has surface rough areas, whereof the dimensional characteristics fulfil the relationship $$\frac{e}{2Ra} \leq 3,$$

where Ra denotes the mean deviation or arithmetic mean of the distances separating the peaks and the troughs of said rough area relative to a median line and where e denotes the thickness of the separating layer.

11. The method as claimed in claim 10, wherein the dimensional characteristics of surface rough areas of the stud fulfil the relationship $$\frac{e}{2Ra} \le 1.$$

12. The method as claimed in claim 1, wherein the stud is obtained by the deformation of a substrate on which the first layer of conducting material is deposited, and by subsequent deposition of said first conducting layer, which fully coats said substrate and the deformation formed of said substrate.

13. The method as claimed in claim 1, wherein the stud is added to a substrate, on which the first layer of conducting material is deposited, and is then coated with a conducting material constituted by the deposition of the lower conducting layer.

14. The method as claimed in claim 1, wherein the stud is obtained by deformation of the first lower conducting layer, in particular by laser attack.

15. The method as claimed in claim 1:
wherein the stud is made out of an insulation material, deposited on the lower conducting layer, and defining at the periphery thereof a non-wettable zone relative to the semi-conducting or insulation material subsequently deposited on the first conducting layer and constituting the separating layer, and wherein electrical conduction between the lower conducting layer and the upper conducting layer results from the deposition of said upper conducting layer, which then fills the non-wetting zone defined around the stud.

16. The method as claimed in claim 1, wherein the external surface of the stud is chemically modified by coating with SAM non-wettable by the separating layer when the latter is still in the liquid state.

17. The method as claimed in claim 16, wherein the SAMs have a thiol group (—SH) and a hydrophobic group (of the alkyl, alkylhalogenated, benzyl type, etc.).

18. The method as claimed in claim 1, wherein the external surface of the stud is physically modified by plasma attack.

* * * * *